US007725086B2

(12) United States Patent
Maerzinger et al.

(10) Patent No.: US 7,725,086 B2
(45) Date of Patent: May 25, 2010

(54) METHOD AND APPARATUS FOR CONTROLLING A TRANSMITTER

(75) Inventors: Guenter Maerzinger, Linz (AT); Gerald Eschlboeck, Eferding (AT); Timo Gossmann, Neubiberg (DE); Gunther Kraut, Egmating (DE); Christian Mayer, Linz (AT); Burkhard Neurauter, Linz (AT)

(73) Assignee: Infineon Technologies AG, Munich (DE)

( * ) Notice: Subject to any disclaimer, the term of this patent is extended or adjusted under 35 U.S.C. 154(b) by 1048 days.

(21) Appl. No.: 11/301,741

(22) Filed: Dec. 13, 2005

(65) Prior Publication Data

US 2006/0154626 A1  Jul. 13, 2006

(51) Int. Cl.
*H04B 1/04* (2006.01)

(52) U.S. Cl. .................... 455/110; 455/126; 455/127.1; 370/318

(58) Field of Classification Search .................. 455/110
See application file for complete search history.

(56) References Cited

U.S. PATENT DOCUMENTS

| 6,404,823 | B1 * | 6/2002 | Grange et al. ............... 375/297 |
| 6,606,308 | B1 * | 8/2003 | Genest et al. ............... 370/318 |
| 2007/0153937 | A1 * | 7/2007 | Itkin et al. .................. 375/297 |

* cited by examiner

*Primary Examiner*—Yuwen Pan
*Assistant Examiner*—Ajibola Akinyemi
(74) *Attorney, Agent, or Firm*—Coats & Bennett, P.L.L.C.

(57) ABSTRACT

A transmitter includes a transformer that is configured to transform a baseband signal into an amplitude information signal and a phase information signal. The transmitter includes a ramping control unit configured to generate a power control signal. The transmitter includes a mixer that is configured to combine the amplitude information signal with the power control signal and produce a second amplitude information signal. The transmitter includes a modulator that is configured to modulate the second amplitude information signal on the phase information signal and produce an output signal.

17 Claims, 2 Drawing Sheets

METHOD AND APPARATUS FOR CONTROLLING A TRANSMITTER

BACKGROUND

This application claims priority to German Patent Application No. 10 2004 059 985.8, filed on Dec. 13, 2004.

Transmitters are used for the transmission of information via wireless or wire line data traffic channels. To transmit information from different users through a single data channel, communication methods such as Frequency Division Multiple Access (FDMA) and Code Division Multiple Access (CDMA) can be used. Another method that allows for different information to be transmitted in different time slots is Time Division Multiple Access (TDMA) which is used in European telecommunication standards such as the Global System for Mobile Communications (GSM).

The power level of an output signal produced by a transmitter working in a TDMA system has to be ramped up or down according to a well defined ramping profile. In a GSM communication system, this profile is defined as a time dependent sequence of power level values such as described in the $3^{rd}$ Generation Partnership Project (3GPP) specification TS 45.005. This standard also defines the allowed spectral densities of the output signal.

Another standard that is based on the GSM standard and that uses TDMA is the Enhanced Data GSM Environment (EDGE) standard. To transmit using standards such as EDGE, transmitter modulation units must modulate an output signal according to an 8-PSK (phase shift keying) scheme. The modulation of the output signal is a phase and amplitude binary coding of the transmitted information. The use of amplitude modulation with this approach requires that the transmitter include a linear transmission chain in order to avoid distorting the output signal.

One approach that can be used to ramp the output signal of a transmitter is to use a Variable Gain Amplifier (VGA). The VGA can be used to control the power level of signals such as a baseband signal or a high frequency signal modulated on a carrier frequency.

Another approach that can be used to control the power level of the output signal of a transmitter is a Programmable Gain Amplifier (PGA). With the PGA, a digital control word is set in order to adjust the gain of the PGA. The architecture of the transmitter for the PGA must be designed to allow for a continuous ramping of the power level of the output signal between a zero value and a target value in accordance with the standard being used.

In architectures that use a VGA or PGA, an output stage is used to convert a signal to a desired output power level before the signal is inserted into the transmission channel (e.g. by using an antenna). To achieve different output power levels, any amplification produced by elements within the transmitter signal path must be compensated by the VGA and/or the PGA. To provide this compensation, the amplifiers must be designed to have large dynamic ranges. For example, with GSM EDGE, the dynamic range has to be more than 40 dB in the high transmission band. With a VGA, this large dynamic range in combination with the spectral density and low noise requirements for the output signal results in high current consumption for the transmitter.

SUMMARY

One embodiment of the invention provides a transmitter. The transmitter includes a transformer that is configured to transform a baseband signal into an amplitude information signal and a phase information signal. The transmitter includes a ramping control unit configured to generate a power control signal. The transmitter includes a mixer that is configured to combine the amplitude information signal with the power control signal and produce a second amplitude information signal. The transmitter includes a modulator that is configured to modulate the second amplitude information signal on the phase information signal and produce an output signal.

BRIEF DESCRIPTION OF THE DRAWINGS

Embodiments of the invention will be explained in detail in the following text with reference to the accompanying drawings, in which.

DETAILED DESCRIPTION

Figure 1:
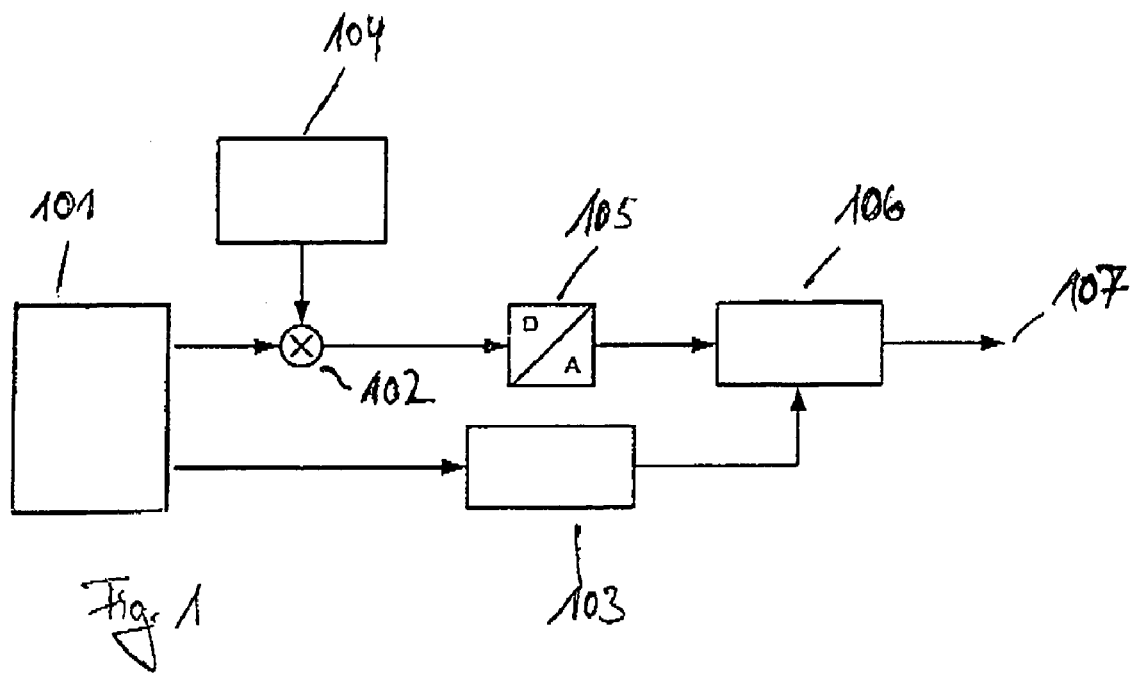
FIG. 1 is a schematic representation illustrating one embodiment of a transmitter.

In one embodiment, an inexpensive and power-efficient architecture for a transmitter enables the transmitter to transmit amplitude-modulated output signals.

In one embodiment, a transformer transforms a baseband signal into an amplitude information signal and a phase information signal. A ramping control unit generates a power control signal. A mixer is coupled to the transformer and to the ramping control unit. The mixer combines the amplitude information signal with the power control signal to produce a second amplitude information signal. A modulator is coupled to the transformer and to the mixer. The modulator modulates the second amplitude information signal on the phase signal, or derivative thereof, to produce an output signal.

In one embodiment, the invention combines the power control information, i.e. the ramping up or ramping down information, and the amplitude information of a signal to be transmitted by the transmitter.

In one embodiment, the transmitter has a polar modulation architecture. With this architecture, the baseband signal representing the information to be transmitted is transformed into its amplitude and phase components. This is advantageous if information is coded by an 8-PSK coding or any other suitable coding that includes amplitude and phase components. In consequence it might be used for any high frequency signal such as a transmission signal. In this embodiment, the polar modulation architecture is a very robust and very efficient implementation of the transmitter. This efficiency results in part in this embodiment from the ability to perform digital signal processing in the transmitter chain.

In one embodiment, ramping may be performed at the beginning or the end of a burst in the transmission system. The ramping information is combined with the amplitude information by combining the amplitude information signal and the power control signal. The resulting second amplitude information signal is includes the amplitude information of the signal to be transmitted and the information for the ramping procedure performed by the transmitter. In various embodiments, the ramping up starts from a low power level or a zero power level and the power level increases continuously or stepwise to a power level required by the transmission system. In various embodiments, the profile of the ramping is defined in a communication standard or is caused by restrictions to the power supply or other operational parameters of the transmitter. In these embodiments, the ramping down of the transmitter is performed accordingly for similar reasons.

In one embodiment, the transmitter includes a digital-to-analog converter disposed between the mixer and the modulator. In this embodiment the ramping information is represented by digital signals and can be changed or adapted. In one embodiment, after the digital-to-analog conversion, the second amplitude information signal is brought onto the phase information signal to produce the output signal. In this embodiment, the amplitude path of the transmitter is a digital path which allows for a robust and efficient implementation of the transmitter.

In one embodiment, the transmitter includes a modulator that performs modulation and digital-to-analog conversion in a single step. In other embodiments, there are other suitable approaches to perform digital-to-analog conversion and to place a digital-to-analog conversion unit into the amplitude path of the transmitter.

In one embodiment, the transmitter includes a phase modulator disposed between the transformer and the modulator. The phase modulator modulates the phase information signal on a carrier frequency signal. The carrier frequency in various embodiments can range from 900 MHz to 2.5 GHz, depending on the requirements of the communication system. In other embodiments the carrier frequency can have other suitable values. In other embodiments any suitable architecture for the transmitter or the carrier frequency can be used.

In one embodiment, the phase modulator is a digital phase modulator. In this embodiment, mostly digital signal processing occurs in the phase path of the transmitter. The performance of the transmitter with respect to attributes that include linearity, noise suppression or dynamic range, is enhanced as compared to other architectures. Other embodiments of a phase modulator are described in German patent applications DE 19 929 167 A1 and DE 10 255 863 A1, both incorporated herein by reference.

In one embodiment, the transmitter includes a ramping control unit that includes a memory unit. The memory unit retains at least one ramping profile of the power control signal. In one embodiment, the ramping profile is a set of values representing the course of ramping up or ramping down the power level. Because the memory unit retains this information, there is advantageously no need for a large calculation unit to determining the respective values. In one embodiment, the memory unit includes a look-up table that stores one or more profiles for different ramping up and/or ramping down scenarios. In one embodiment, the look-up table stores a profile that is used both for ramping up and ramping down. In one embodiment, the ramping information is read out in a reverse order from the look-up table to produce the ramping down scenario from the ramping up scenario, or to produce the ramping up scenario from the ramping down scenario.

In various embodiments, if different ramping profiles are retained in the memory unit, different suitable courses of ramping up and/or ramping down scenario can be selected. In various embodiments, the courses of ramping up and/or ramping down can be selected based on different operation conditions such as the defined parameters of the transmission channel, or can be selected due to different choices of communication standards if the transmitter is used in a multistandard system. In various embodiments, the transmitter is used for transmitting information in GSM EDGE, UMTS, W-CDMA or WLAN. In other embodiments, the transmitter is used for transmitting information using other suitable communication standards.

In one embodiment, a ramping profile is defined by a raised cosine function:

$$F(x)=A(1-B\cos(Cx)) \tag{1}$$

By an appropriate choice of the parameters A, B and C, a well shaped spectral density during ramping up or ramping down can be selected.

In one embodiment, the transmitter includes a multiplier disposed between the mixer and the memory unit. The multiplier includes a first input configured to receive a power level signal and a second input configured to receive a value of a profile retained in the memory unit. The multiplier includes an output that is coupled to the mixer. In this embodiment, the memory unit retains the course of the ramping profile and the actual power level to be reached is defined by the power level signal. This embodiment represents a flexible architecture that allows for an easily performed adaptation to different operational conditions in the transmission system. In one embodiment, if the noise level in the transmission channel is very high, the transmitter may raise the power level only without choosing a different ramping profile. In this embodiment, the number of ramping profiles retained in the memory unit can be minimized. In this embodiment, the size or storage capacity of the memory unit can be minimized.

In one embodiment, the output of the multiplier is coupled to an input of a sampler that includes an output coupled to an interpolation filter. In this embodiment, the interpolation filter is coupled to the mixer. In this embodiment, the sampler values of a suitable ramping profile are retained in the memory unit and are read out at a first sampling rate. The interpolation filter interpolates the values at a suitable second sampling rate. In one embodiment, the second sampling rate is higher than the first sampling rate. In other embodiments, the second sampling rate can have any suitable relationship to the first sampling rate. In various embodiments, the values are brought by the mixer onto the amplitude information signal. In one embodiment, the mixer is implemented as a multiplier that multiplies continuously the digital power control information and the digital amplitude information.

In one embodiment, the second sampling rate is selected to be higher than the first sampling rate. In this embodiment, the number of values of a ramping profile that are retained in the memory unit is minimized and more values that are interpolated by the interpolation filter and are brought on or combined with the amplitude information signal. In this embodiment, the size of the memory unit can be further reduced.

In one embodiment, a scaling unit is disposed between the interpolation filter and the mixer. In various embodiments, the scaling unit or scaler can be a simple amplifier, a unit performing a multiplication or division with a defined number, such as a 2, 4, 8, or numbers having an integer logarithm by 2. In one embodiment, the scaler includes the add function. In other embodiments, other suitable approaches or factors can be used to scale the power control signal. In one embodiment, the scaler allows for a simple implementation of the interpolation filter. In one embodiment, amplification of the power control signal by the interpolation is compensated.

FIG. 1 is a schematic representation illustrating one embodiment of a transmitter. The transmitter includes a transformer 101 that produces a first amplitude information signal and a phase information signal. The transformer 101 produces these signals according to ingoing signals that in various embodiments might be delivered as Cartesian information such as quadrature modulated information or in-phase and quadrature signals. In various embodiments, the ingoing signals may be provided by a baseband unit that includes a microcontroller, a DSP or other suitable processing element.

In the illustrated embodiment, the first amplitude information signal is fed into a first input of a mixer 102. The phase information signal is fed into a phase modulator 103. The phase modulator 103 modulates the phase information signal on a carrier frequency which is defined by the transmission channel. In various embodiments, the phase modulator 103 may be implemented according to the architecture described in German patent application DE 19 929 167 A1 or the architecture described in DE 10 255 863 A1.

In the illustrated embodiment, the transmitter includes a ramping control unit 104 that provides a power control signal that represents the ramping up or ramping down procedure for the transmitter. The ramping control unit 104 is connected to a second input of the mixer 102. The mixer 102 mixes the first amplitude information signal and the power control signal to produce a second amplitude information signal. The mixing is performed by a digital multiplication of the first amplitude information signal and the power control signal. The second amplitude information signal is provided at an output of said mixer 102. This signal includes the amplitude information of the signal to be transmitted and information about the ramping up and/or ramping down of the power level of the transmitter.

The output of mixer 102 is connected to a digital-to-analog converter 105. The digital-to-analog converter 105 converts the second amplitude information signal from a digital form into an analog form of the second amplitude information signal.

An output of the digital-to-analog converter 105 is connected to a modulator 106. An output of the phase modulator 103 is also connected to the modulator 106. The modulator 106 modulates the amplitude information signal in its analog form on the phase information signal being shifted on the carrier frequency of the transmission system. A signal output 107 of the modulator 106 provides an output signal that includes amplitude information, ramping information and/or phase information. In various embodiments, this signal may be filtered, amplified or still further processed before being provided to the transmission channel of the transmission system comprising the shown transmitter.

The embodiment of the transmitter illustrated in FIG. 1 includes digital signal processing in the transmission path. The ramping information is brought on the signal or combined with the signal to be transmitted in the digital domain of the transmitter. This is performed by means of the mixer 102. In other embodiments, other suitable approaches may be used. In various embodiments, the profile of the ramping is defined to be a function such as the raised cosine function in equation (1). This embodiment enables the transmitter to be used in a GSM mobile communication system. In one embodiment, the ramping control unit 104 uses a look up table to generate the power control signal. In other embodiments, the power control signal is generated by using a discrete oscillator or other suitable approach.

Figure 2:
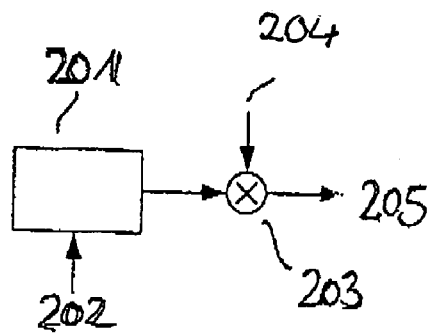
FIG. 2 is a schematic representation illustrating one embodiment of a ramping control unit.

FIG. 2 is a schematic representation illustrating one embodiment of a ramping control unit. While in the illustrated embodiment, the ramping control unit is used in the transmitter as illustrated in FIG. 1, in other embodiments, the ramping control unit can be used in other suitable transmitters. In the illustrated embodiment, the ramping control unit includes a memory unit 201 that comprises an input 202 for feeding a selection signal.

In various embodiments, the memory unit 201 is implemented as storage for constant values or as a look-up table to memorize, i.e. retain, different profiles with respect of a ramping up or down of the transmitter. A selection signal fed into the input 202 selects one of the profiles retained for starting a ramping of the transmitter. In one embodiment, the selection is between a ramping up and a ramping down.

In the illustrated embodiment, the memory unit 201 is coupled to a first input of a multiplier 203. The memory unit 201 is configured to consequently provide a value of a selected profile at a first input, according to a defined clock signal. Power level strength information is provided at a second input of the multiplier 203. The multiplier 203 performs a multiplication of the signal at the first input and the signal at the second input. In one embodiment, the ramping up is performed according to a raised cosine function, and the power level strength information corresponds to the value A of equation (1). This value A may depend on operational conditions such as channel properties or noise conditions. In one embodiment, there is a second memory unit not shown in the drawings to retain different values of the value A. In the illustrated embodiment, the memory unit 201 retains the course of ramping only, whereas the strength of the ramping profile may be chosen in a flexible manner. Multiplier 203 provides a ramping control signal output at 205.

In various embodiments, there are different physical forms of the memory unit 201. One is a static random access memory (SRAM). Other possible forms could be implementations that include, but are not limited to, EEPROM, read only memory (ROM) or a rewritable, non-volatile memory such as an EEPROM or Flash memory.

Figure 3:
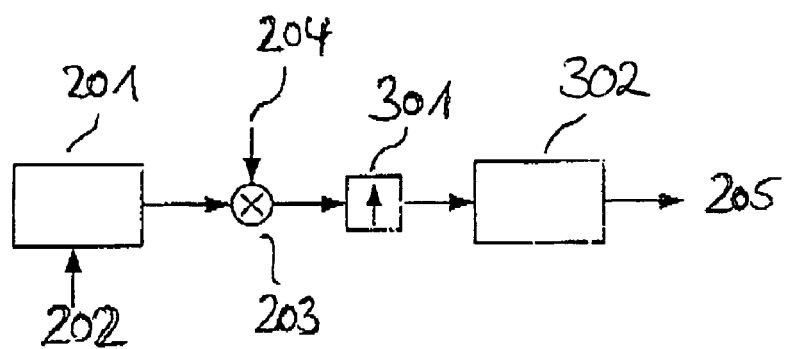
FIG. 3 is a schematic representation illustrating one embodiment of a ramping control unit.

FIG. 3 is a schematic representation illustrating one embodiment of a ramping control. This embodiment has, like the embodiment in FIG. 2, a memory unit 201 configured to receive selection signals via an input 202 to select a ramping profile retained in the memory unit 201. The memory unit 201 provides values representing the course of the selected profile to a first input of a multiplier 203. The multiplier 203 has a second input at which power level strength information is provided. In the illustrated embodiment, the function of multiplier 203 is similar to multiplier 203 as illustrated in FIG. 2.

In the illustrated embodiment, an output of multiplier 203 is connected to an input of a sampler 301. Sampler 301 samples values provided at the output of the multiplier 203 according to a first sampling rate. It provides the sampled data to an input of an interpolation filter 302 that is connected to an output of sampler 301. In one embodiment, the output of the interpolation filter 302 is coupled to the second input of the mixer 102 shown in FIG. 1. In the illustrated embodiment, the course of the ramping profile retained in the memory unit 201 is read out at a low sampling rate and is subsequently raised to a higher data rate by an interpolation performed by the interpolation filter 302. The data rate of the power control signal provided at the output of the interpolation filter 302 may be higher than the sampling rate of the sampler 301.

In the illustrated embodiment, the provision of the sampler 301 has the advantage that a fewer number of values per ramping profile may be retained in the memory unit 201. The memory unit 201 may be sized smaller. The interpolation filter 302 may be disposed to specific ramping profile, e.g. such as a raised cosine profile in doing the interpolation.

Figure 4:
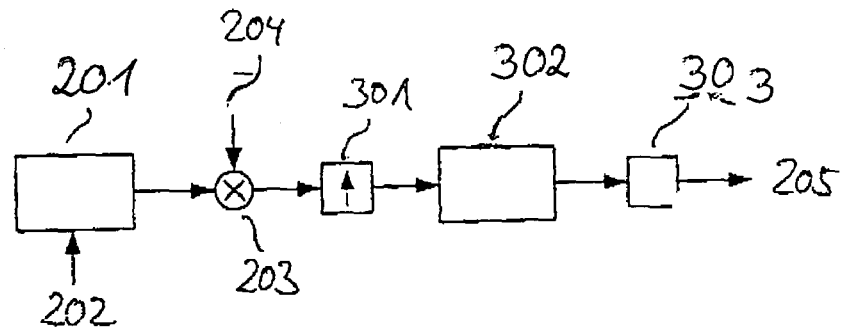
FIG. 4 is a schematic representation illustrating one embodiment of a ramping control unit.

FIG. 4 is a schematic representation illustrating one embodiment of a ramping control unit. In this embodiment, the ramping control unit includes the same elements and properties as the ramping control unit illustrated in FIG. 3. A scaling unit 303 is disposed between the output of the interpolation filter 302 and the ramping control signal output 205.

The scaling unit 303 is configured to compensate an amplification factor due to the interpolation filter 302. It takes into account that the amplification factor is of the form K×2$^a$. In one embodiment, if the scaling unit 303 scales down by factor 2$^{-a}$ and the multiplier 203 accounts for a power level strength information scaled down by K, that is a value A/K, the ramping control unit is compensation for the total amplification caused by the interpolation filter 302.

Figure 5:
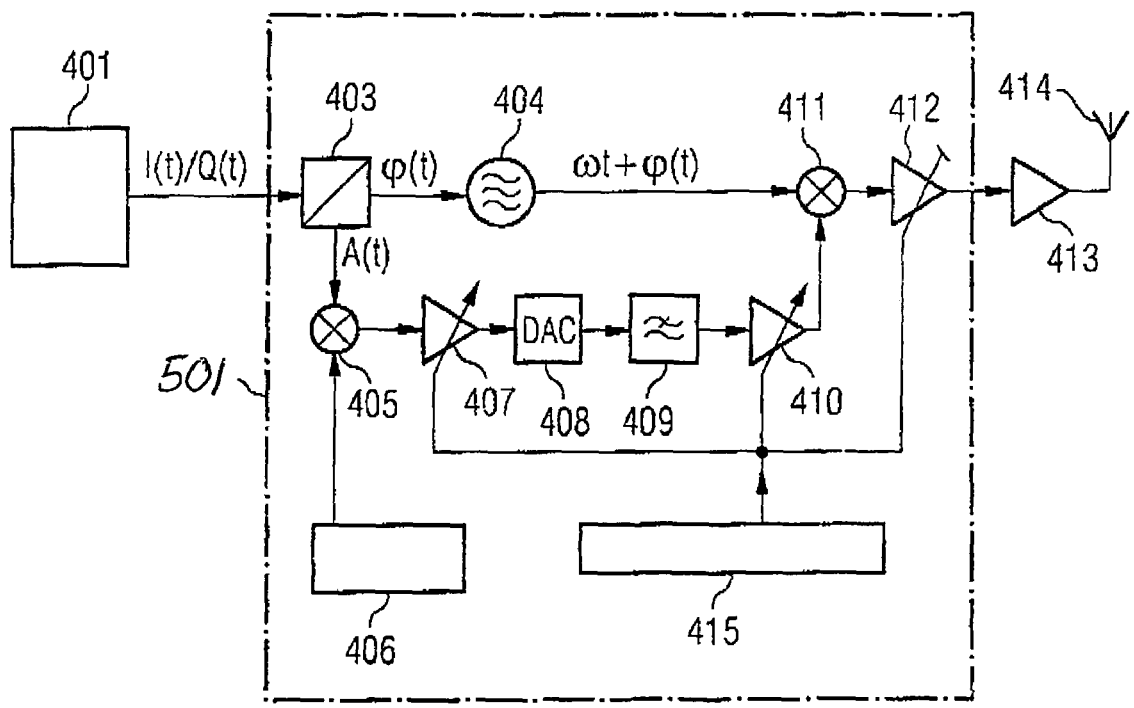
FIG. 5 is a block diagram illustrating one embodiment of a transmitter path in a mobile communication apparatus that includes a transmitter.

FIG. 5 is a block diagram illustrating one embodiment of a transmitter path in a mobile communication apparatus that includes a transmitter. The transmitter includes a baseband unit 401 and a transceiver unit 501. In the illustrated embodiment, the baseband unit 401 provides Cartesian information, i.e. an in-phase signal I(t) and a quadrature signal Q(t). These signals are fed into a transformer 403 which is disposed in the transceiver unit 501. The transformer 403 transforms the Cartesian information into an amplitude information signal A(t) and a phase information signal ϕ(t). The phase information signal ϕ(t) is fed into a phase locked loop 404. The phase locked loop 404 modulates the phase information signal ϕ(t) onto a carrier frequency.

The amplitude information signal A(t) is fed into a mixer 405. The mixing includes a further input to accept a power control signal generated by a digital ramping control unit 406. The mixer 405 multiplies the amplitude information signal A(t) and the ramping control signal to produce a second amplitude information signal.

In various embodiments, the ramping control unit 405 can be implemented as one of the ramping control units illustrated in FIG. 2, FIG. 3, or FIG. 4. The mixer 405 is connected to a first programmable gain amplifier 407 into which is fed the second amplitude information signal. An out put of the first programmable gain amplifier 407 is connected to a digital-to-analog converter 408. An output of the digital-to-analog converter 408 is connected via a high pass filter 409 to an input of a second programmable gain amplifier 410. An analog, filtered and amplified second amplitude information signal is provided at an output of the second programmable gain amplifier 410. This signal is mixed together with the phase information signal provided by the phase locked loop 404 in a second mixer 411. The second mixer 411 produces an output signal that includes amplitude, phase, and ramping information. This output signal is amplified by a third programmable gain amplifier 412 and a power amplifier 413 before being transmitted via a transmission radio channel by means of an antenna 414. A control unit 415 is coupled to the first programmable gain amplifier 407, the second programmable gain amplifier 410 and the third programmable gain amplifier 412, and controls the gain setting of the programmable gain amplifiers. In the illustrated embodiment, control unit 410 controls the gain setting of the transmitter. In one embodiment, the ramping up or ramping down is solely controlled by ramping control unit 406.

What is claimed is:

1. A transmitter having:
   a transformer that transforms a baseband signal into a amplitude information signal and a phase information signal;
   a ramping control unit that generates a power control signal;
   a mixer coupled to said transformer and to said ramping control unit that combines said amplitude information signal with said power control signal to produce a second amplitude information signal; and
   a modulator coupled to said transformer and to said mixer that modulates said second amplitude information signal on said phase signal, or derivative thereof, to produce an output signal.

2. A transmitter according to claim 1,
   having a digital-to-analog converter disposed between said mixer and said modulator.

3. A transmitter according to claim 1,
   having a phase modulator disposed between said transformer and said modulator, which phase modulator modulates said phase information signal on a carrier frequency.

4. A transmitter according to claim 3,
   wherein said phase modulator is a digital phase modulator.

5. A transmitter according to claim 1,
   wherein said ramping control unit is having a memory unit that retains at least one ramping profile of said power control signal.

6. A transmitter according to claim 5,
   having a multiplier disposed between said mixer and said memory unit, said multiplier having a first input configured to receive a power level signal and a second input configured to receive a value of a profile retained in said memory unit; and said multiplier further having an output coupled to said mixer.

7. A transmitter according to claim 6,
   wherein said output of said multiplier is connected to an input of a sampler having an output connected to an interpolation filter; said interpolation filter being coupled to said mixer.

8. A transmitter according to claim 7,
   having a scaling unit disposed between said interpolation filter and said mixer.

9. A transmission apparatus comprising
   means for transforming a baseband signal into an amplitude information signal and a phase information signal;
   means for generating a power control signal;
   means for combining said amplitude information signal with said power control signal to produce a second amplitude information signal;
   means for modulating said second amplitude information signal on said phase information signal, or a derivative thereof, to produce an output signal.

10. A transmission apparatus according to claim 9,
    having means for converting said second amplitude information signal into an analog signal.

11. A transmission apparatus according to claim 9,
    having means for modulating said phase information signal on a carrier frequency.

12. A transmission apparatus according to claim 11,
    wherein said means for modulating is configured to perform a digital phase modulation.

13. A transmission apparatus according to claim 9,
    wherein said means for generating a power control signal is comprising a means for storing at least one ramping profile of said power control signal.

14. A transmission apparatus according to claim 13,
    wherein said means for generating a power control signal is further comprising a means for multiplying a power level signal with a value provided by said means for storing to calculate said power control signal.

15. A transmission apparatus according to claim 14,
    wherein said means for generating a power control signal is comprising a means for sampling an output signal of said means for multiplying and a means for interpolating an output signal of said means for sampling to calculate said power control signal.

16. A transmission apparatus according to claim 15, wherein said means for generating a power control signal is comprising a means for scaling an output signal of said means for interpolating to calculate said power control signal.

17. A method for transmitting a signal, comprising:

transforming a baseband signal at a transformer into an amplitude information signal and a phase information signal;

generating a power control signal at a ramping control circuit;

combining the amplitude information signal with the power control signal at a mixer to produce a second amplitude information signal; and modulating the second amplitude information signal on the phase information signal, or derivative thereof, at a modulator to produce an output signal.

* * * * *